US008616459B2

(12) United States Patent
Sykkö et al.

(10) Patent No.: US 8,616,459 B2
(45) Date of Patent: Dec. 31, 2013

(54) SUSPENDABLE PACKAGES WITH RADIO FREQUENCY IDENTIFICATION

(75) Inventors: Tuomas Sykkö, Tampere (FI); Thomas Wythe, Friedrichsdorf (DE)

(73) Assignee: Smartrac IP B.V., Amsterdam (NL)

( * ) Notice: Subject to any disclaimer, the term of this patent is extended or adjusted under 35 U.S.C. 154(b) by 0 days.

(21) Appl. No.: 13/704,702

(22) PCT Filed: Jun. 24, 2010

(86) PCT No.: PCT/FI2010/050547
§ 371 (c)(1),
(2), (4) Date: Jan. 4, 2013

(87) PCT Pub. No.: WO2011/161302
PCT Pub. Date: Dec. 29, 2011

(65) Prior Publication Data
US 2013/0105586 A1    May 2, 2013

(51) Int. Cl.
*G06K 19/06* (2006.01)
(52) U.S. Cl.
USPC .......................................................... 235/492
(58) Field of Classification Search
USPC .......................................................... 235/492
See application file for complete search history.

(56) References Cited

U.S. PATENT DOCUMENTS

2007/0064578 A1    3/2007    Usami et al.
2009/0167500 A1 *  7/2009    Braun et al. ................. 340/10.1

FOREIGN PATENT DOCUMENTS

JP    2002051882 A    2/2002
WO    2005111914 A1    11/2005

* cited by examiner

*Primary Examiner* — Kristy A Haupt
(74) *Attorney, Agent, or Firm* — Ziegler IP Law Group, LLC.

(57) ABSTRACT

A product that comprises a mounting hole or a preform for the mounting hole and a radio frequency identification transponder for wireless identification, said transponder comprising at least an integrated circuit and wiring, wherein the wiring of the transponder at least partly encircles the mounting hole or the preform, is disclosed. The product may be configured to break when the product is ripped between the mounting hole and an edge of the product. Furthermore, the product may operate in two modes depending on whether or not an electrically conductive object is penetrating the mounting hole, and may be configured to be suspended in connection with an electrically conductive hanger by using the mounting hole. In addition, a method to produce such a product is disclosed. To facilitate a different reading distance or operating frequency for a suspended and a free product, a method to change the operating frequency or the reading distance of a radio frequency identification transponder of at least one product comprising a mounting hole is, wherein the method comprises penetrating an electrically conductive object through the mounting hole, is disclosed. In addition, for the electronic article surveillance purposes, a reader device configured to communicate with a radio frequency identification transponder of at least one product comprising a mounting hole wherein the reader device comprises an antenna configured to penetrate the mounting hole is disclosed.

15 Claims, 9 Drawing Sheets

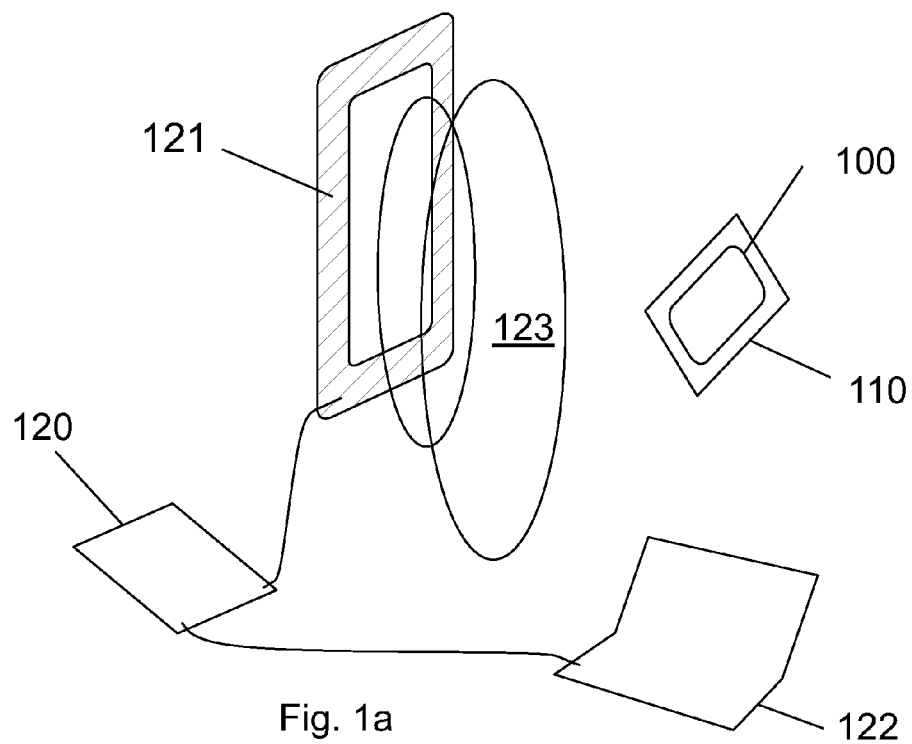
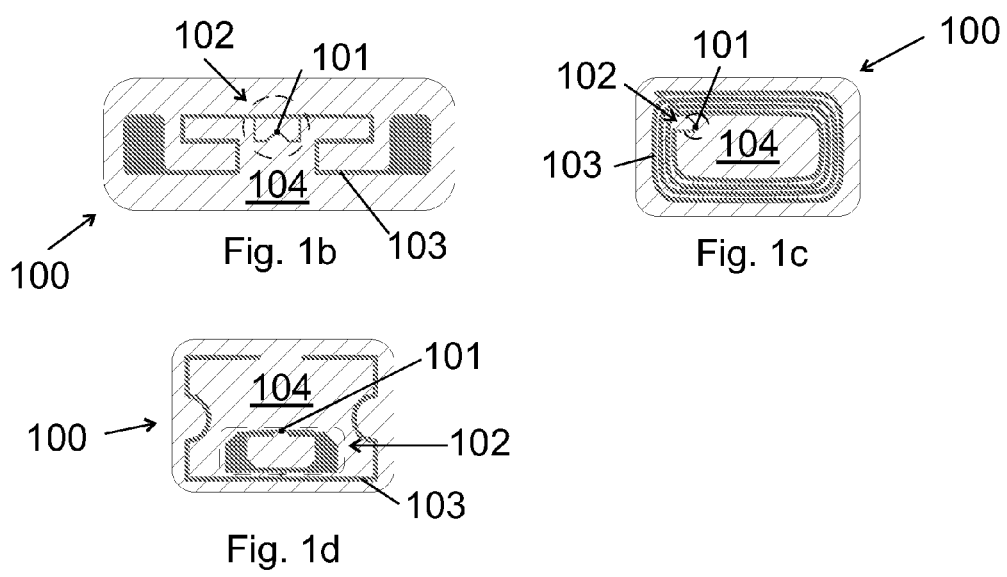

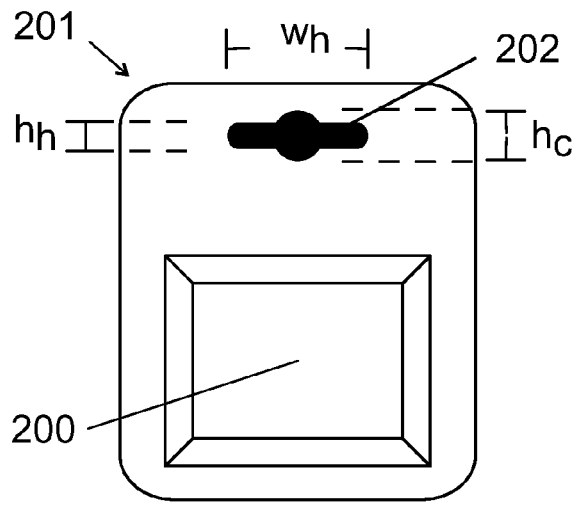
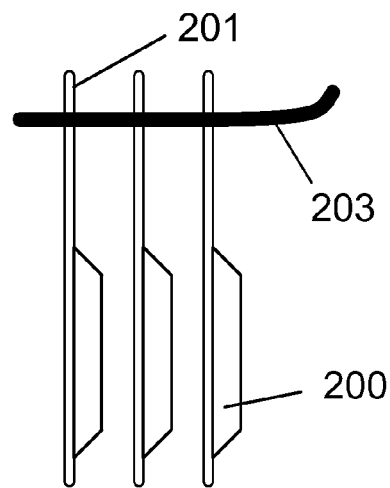
Fig. 2a
Fig. 2b
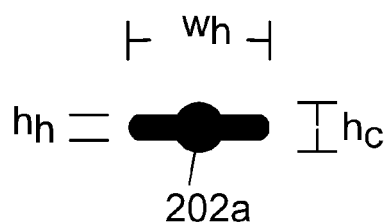
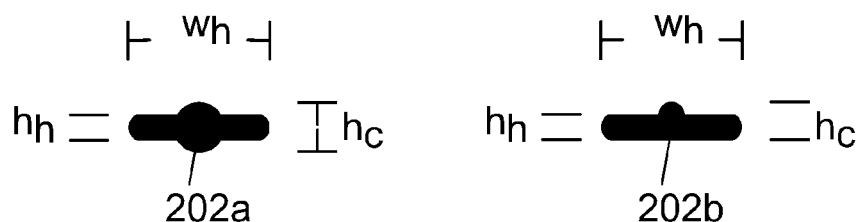
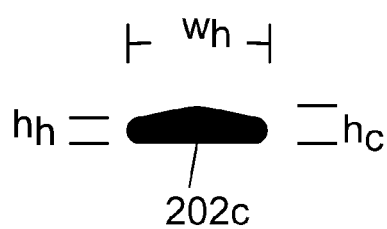
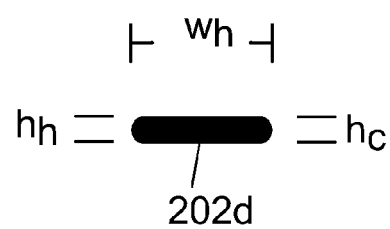
Fig. 2c

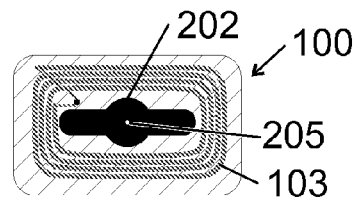
Fig. 5a
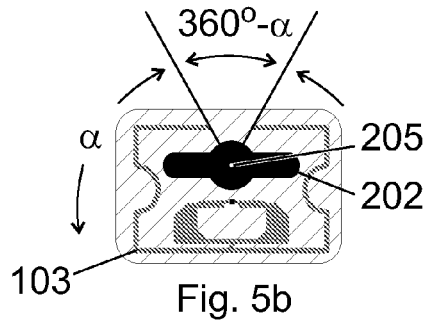
Fig. 5b
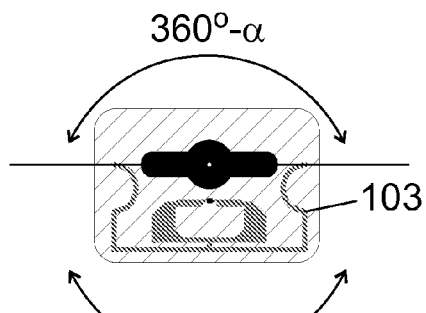
Fig. 5c
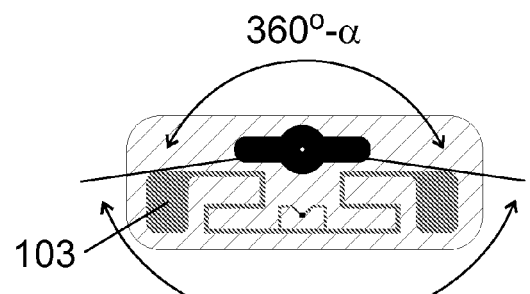
Fig. 5d
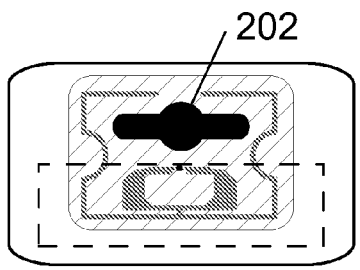 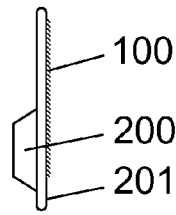
Fig. 6a
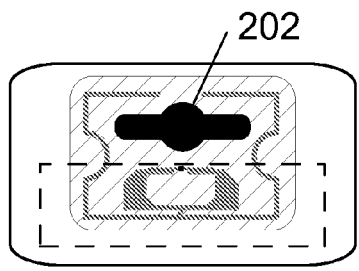 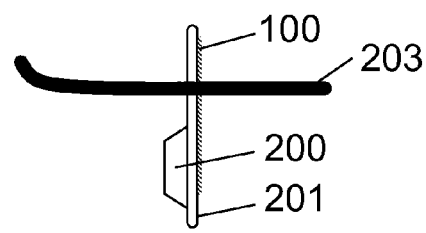
Fig. 6b

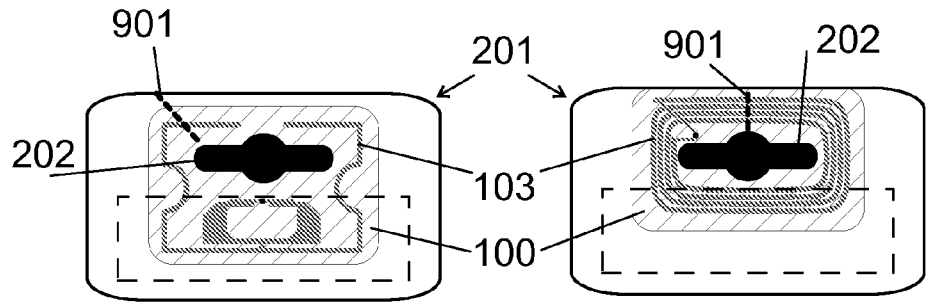
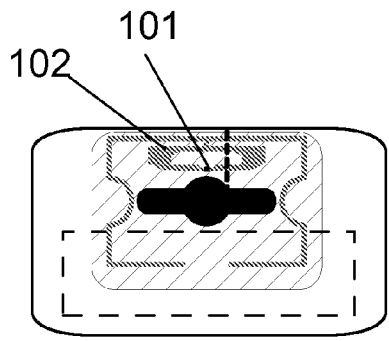
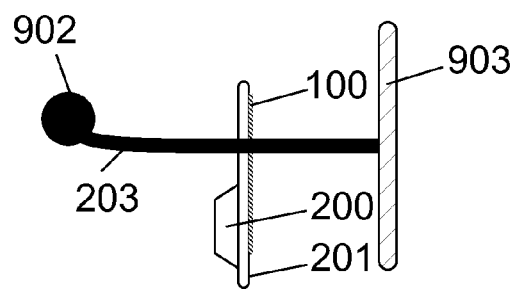
Fig. 9a  Fig. 9b  Fig. 9c  Fig. 9d
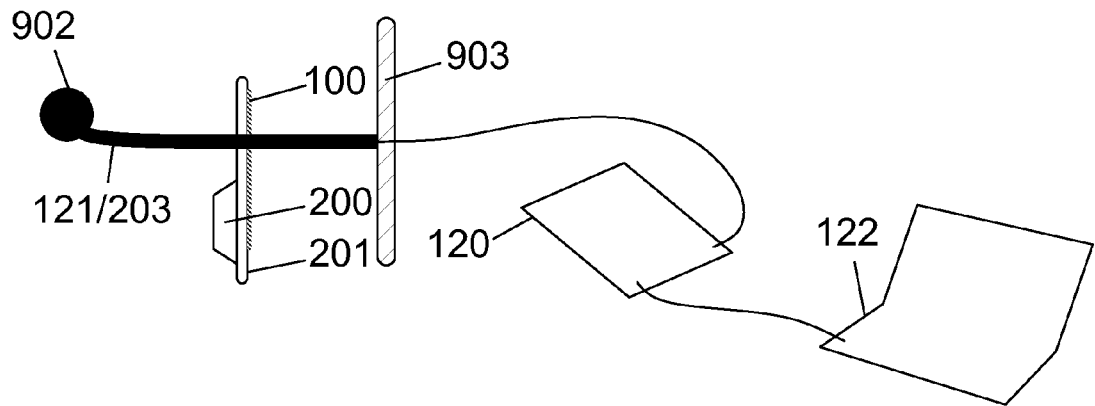
Fig. 9e

SUSPENDABLE PACKAGES WITH RADIO FREQUENCY IDENTIFICATION

TECHNICAL FIELD

The present invention relates to Radio Frequency Identification (RFID) inlays and RFID tags that are used in suspendable packages, articles, or products having only limited space available for the RFID inlay.

BACKGROUND OF THE INVENTION

RFID tags are small sized devices, typically in a label format, that can be applied to or incorporated into a product, device or even animal for the purpose of identification and tracking of the item in question using radio waves. Some RFID tags can be read from several meters away and beyond the line of sight of the reader. These capabilities make the use of RFID tags very interesting over optical bar codes in product logistics, even if the data contained in the RFID tags would be equal to the UPC (Universal Product Code), EAN (European Article Number) codes traditionally used in bar codes. EPC (Electronic Product Code) codes used globally in RFID tags make it possible to store more information in a standardized manner to the RFID tags than has been possible in case of basic optical bar codes. Thus, RFID tags are becoming increasingly popular in everyday product logistics in many commercial fields.

RFID is currently also used in Electronic Article Surveillance (EAS) systems. In such an application, RFID technology is used to detect the presence or absence of an object within the reading distance of a reading device. Articles in these RFID based EAS systems are detected by detecting an RFID tag or RFID inlay that is attached to an article or the package of an article.

An RFID tag typically comprises an RFID inlay and an overlay structure forming the RFID tag. The RFID inlay is an electrically fully functional RFID transponder device, that is, a device that works as a transmitter and responder. The main components of the transponder are an electronic integrated circuit and an antenna. An inlay further comprises a substrate and other optional layers to support the transponder. The overlay structure of an RFID tag forms further mechanical support for the inlay and it can be used for printing trademarks, brand names etc. Overlays can be e.g. laminated or molded on the inlay. A typical RFID inlay is flexible, and, depending on the overlay, the RFID tag can be flexible or rigid. RFID inlays are typically sold in reels or rolls comprising hundreds to thousands of inlays. Generally the RFID tags can be either active or passive depending on whether they include an internal energy source, or they are operated with the electro-magnetic field generated by the RFID reader device.

According to "A BASIC INTRODUCTION TO RFID TECHNOLOGY AND ITS USE IN THE SUPPLY CHAIN" (LARAN RFID, January 2004) RFID tags can operate on several frequencies. Four frequency ranges are generally defined as: (1) low frequency (LF); frequencies below 135 kHz, (2) high frequency (HF); frequencies around 13.56 MHz, (3) ultra high frequency (UHF); frequencies between 860 kHz and 960 kHz, and (4) microwave; frequencies around 2.54 MHz. RFID tags can be designed to operate near the reader device, or far from the reader device. In case tags are designed to work near the reader device, the tags are known as near field tags, and the energy transfer from the reader device to the RFID tag is mostly through the magnetic field generated by the RFID reader. Data transfer from the tag to the reader device in near field case is enabled by inductive coupling, where the RFID tag changes its impedance, and the alternating load is detected by the reader device. Sometimes the communication in the near field is known as near field communication (NFC). In case the tags are designed to work far away from the reader device, the tags are known as far field tags, and the energy transfer from the reader device to the tag is mainly through the electric field. Part of the RFID tag operates as an antenna, and the RFID device gets its energy from the electric field. In the far field case, data transfer from the tag to the reader device is enabled by field backscattering. The theoretical limit between the near field and the far field is proportional to $\lambda/2\pi$, where $\lambda$ is the wavelength of the electromagnetic radiation generated by the reader device, equaling to c/f, where c is the speed of radiation (i.e. light) and f is the frequency. As a result, the limit between near and far fields for a HF RFID system would be 3.5 m and for an UHF RFID system the limit would be 5 cm. One can also define a transition zone between the near field and the far field.

In the near field tags, the strength of the inductive coupling between the RFID tag and the RFID reader is proportional to the area enclosed by the wiring of the RFID inlay. In the far field tags, the wiring of the RFID inlay performs as an antenna, and the length of the wiring must therefore be proportional to the wavelength $\lambda$.

Even if these wirings can be made to meander in the inlay, these physical principles determine size limits for the RFID inlays, e.g. the minimum size.

Typically RFID tags (or in some cases the RFID inlays) are attached to the articles or packages thereof. In case the article or package thereof is small in size, the RFID tag can take up a large portion of the article or package. Many of such articles are sold in stores, where they are placed for sale to a hanger. The mounting hole for the hanger also takes up some space of the package already with limited space available. Therefore, especially in case of small articles, it may be difficult to find space both for the mounting hole for the hanger and the RFID tag.

The hangers and respective hanger holes used in the art have been standardized for their dimensions. The frequently used versions include, for example, the so called "Euroslot", "Inverted T", "Osha" and "Oval" which will be described in more detail later.

SUMMARY OF THE INVENTION

Despite of a wide variety of different existing RFID tag solutions there still is a clear need for a solution that would facilitate improved capability to tag small sized suspendible items and to utilize the full potential of RFID tags including the possibilities to use RFID for EAS purposes. In order to improve the capability to tag small sized suspendible items, a product comprising a mounting hole or a perform for the mounting hole and a radio frequency identification transponder for wireless identification, said transponder comprising at least an integrated circuit and wiring, wherein the wiring of the transponder at least partly encircles the mounting hole, is disclosed. Furthermore, a method to produce such a product is disclosed. For the EAS purposes, a reader device configured to communicate with a radio frequency identification transponder of at least one product comprising a mounting hole wherein the reader device comprises an antenna configured to penetrate the mounting hole is disclosed. Furthermore, to facilitate a different reading distance or a different operating frequency for a suspended product and an unsuspended product, a method to change the operating frequency or the reading distance of a radio frequency identification transponder of at least one product comprising a mounting hole is, wherein the method comprises penetrating an electrically conductive object through the mounting hole, is disclosed.

DESCRIPTION OF THE DRAWINGS

In the following examples, the embodiments of the invention will be described in more detail with reference to the appended drawings, in which FIGS. 1a, 1b, 1c, and 1d show schematically an RFID reader system and three RFID inlays, respectively, FIGS. 2a, 2b, and 2c show an article in a suspendible package with a Euroslot hanger hole, three suspendible packages in a hanger, and different types of hanger holes respectively, FIGS. 5a, 5b, 5c, and 5d show RFID inlays of which wirings that encircle or partly encircle a mounting hole, FIGS. 6a, 6b, 6c, 6d, and 6e show an RFID device working in the stand-alone mode, the RFID device working in the extended mode, RFID devices working in the extended mode, an RFID reader system, and a handheld RFID reader system, respectively, FIGS. 9a, 9b, 9c, 9d, and 9e show three tamper-evident packages comprising RFID inlay, a tamper-evident or tamper proof RFID system, and a tamper-proof RFID system, respectively.

DETAILED DESCRIPTION OF THE INVENTION

Figure 3A:
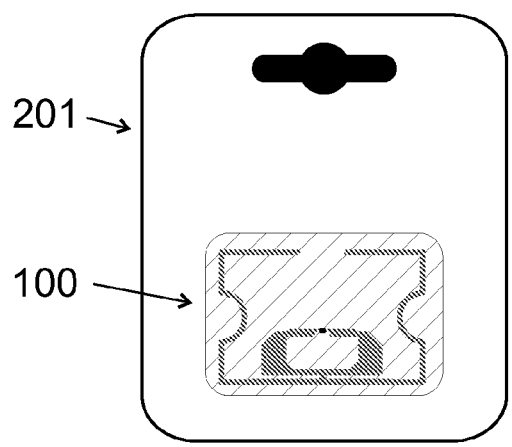
FIGS. 3a, 3b, 3c, and 3d show a suspendible package with a Euroslot hanger hole comprising an RFID inlay, a small suspendible package and an RFID inlay, a small suspendible package comprising an RFID inlay, and a smaller suspendible package comprising an RFID inlay, respectively.

FIG. 1a shows schematically a typical RFID system with an RFID reader. The RFID reader system comprises at least one RFID device 110, an RFID reader device 120, and a host computer 122. The RFID device 110 may be an RFID tag, or it may be a product comprising an RFID tag or an inlay. In both cases, the RFID device comprises an RFID inlay 100. The RFID reader device 120 comprises an antenna 121. With the antenna 121 the RFID reader device 120 generates an RF field 123. In response to the RF field 123, the RFID device 110 scatters the RF field back to the antenna or modifies the inductive load seen by the reader device. In both cases the backscattered signal thus sent from the RFID device 110 can be read by the reader device 120. The signal typically contains at least information indicative of the RFID device, e.g. an identity number of the RFID device 110 and possibly further product information related to the tagged item. The reader device 120 may be coupled to a host computer 122 to obtain other information regarding the RFID device of this particular identity number and/or to supply tag/product information to further remote systems.

FIGS. 1b-1d show some typical layouts for RFID inlays 100 used in the art. The RFID inlays comprise an integrated circuit (IC) chip 101, wiring 103, and a substrate 104. The wiring comprises an impedance matching section 102 and an electromagnetic radiator section, either an antenna (typical for far field RFID) or a coil (typical for near field RFID). The substrate may be e.g. polyvinyl chloride (PVC), polyethylene terephthalate (PET), or paper. The wiring may be made of conductive material, such as copper, aluminum, silver, gold or a conductive ink comprising any of these metals or other conducting material. The chip 101 is bonded to the substrate such that input/output (I/O) pads of the chip 101 are connected to wiring 103. Known bonding techniques include adhesive joining with either electrically conductive adhesive (isotropically conducting adhesive ICA, or anisotropically conducting adhesive, ACA), or a non-conductive adhesive, NCA. These adhesives can be supplied in film form, when the adhesives are known as ICF, ACF, or NCF, where the last letter stands for film. For these bonding techniques, the I/O pads of the chip 101 have to be bumped e.g. with gold bumps. In case of RFID inlays, the chips 101 are small, typically a square with the side length 0.5 mm. As discussed above, the size of wiring has to be relatively large. Typically the length of the UHF RFID antenna (wiring) has to be $\lambda/4$, which in typical UHF application (900 MHz) is about 8 cm. In addition to frequency, the permittivity of the substrate also affects the wavelength, and therefore the size of the antenna. As for the near field RFID inlays, the area enclosed by inlay wiring may be for example around 1 $cm^2$ and upwards for inductive coupling. It is also noted that the coupling depends on the number of wiring turns enclosing the area. In addition, antenna structures comprising properties of both far field and near field wirings have been used. FIG. 1b shows an example of a far field RFID inlay, where the wiring 103 comprises an antenna, arranged to meander on the substrate 104. FIG. 1c shows a near field RFID inlay, where the wiring 103 forms a coil, wherein in the case of FIG. 1c the coil has four turns. FIG. 1d shows an RFID inlay of which structure comprises properties of both a typical far field inlay and a typical near field inlay. It should be noted that the FIGS. 1b-1d are given here as examples only describing some possible RFID structures. Other structures are also possible and known to a person skilled in the art.

The RFID tag (or the RFID inlay) may be attached to the article or to the package of the article. FIG. 2a shows, as an example, a front view of an article 200 in a package 201. The package 201 is designed to be placed to hanger in a store. Thus, the package 201 may comprise a standardized mounting hole 202 for the hanger. FIG. 2b is a side view of a typical hanger 203 in a store, wherein the hanger 203 contains packages 201, and in this case three packages. A hanger is typically relatively long, thin, and rigid. Also, as depicted in FIG. 2b, the hanger may be perpendicular to a plane of a surface of the package. FIG. 2c shows examples of some standardized mounting holes. The reference number 202a shows a Euroslot type hanger hole, 202b an Inverted T type hanger hole, 202c an Osha type hanger hole, and 202d an oval hanger hole. A special type of the oval hanger hole is the circular hanger hole, where the width $w_h$ equals the heights $h_c$ and $h_h$. Moreover, depending on the roundness of the corners of the oval mounting hole, the hole can also be a square. Thus, the oval hole allows for more flexibility in the measures. Typical measures for these mounting holes are given in Table 1. The sizes are standardized in inches, and given in the table with the accuracy of two numbers.

TABLE 1

Standard hanger holes and their measures.

|  | $w_h$ (mm) | $h_h$ (mm) | $h_c$ (mm) |
|---|---|---|---|
| Euroslot | 32 | 6.4 | 13 |
| Inverted T | 25-32 | 4.8-32 | 6.4-10 |
| Osha | 13-37 | 4.0-6.4 | 6.4-10 |
| Oval | 6.4-25 | 6.4-13 | 6.4-13 |

Figure 3B:
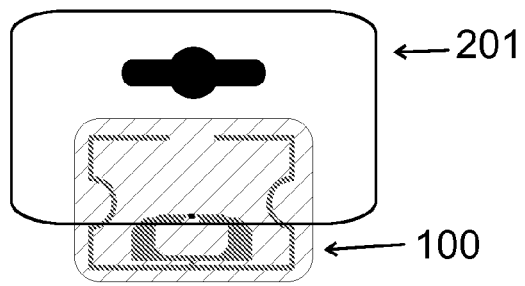
Figure 3C:
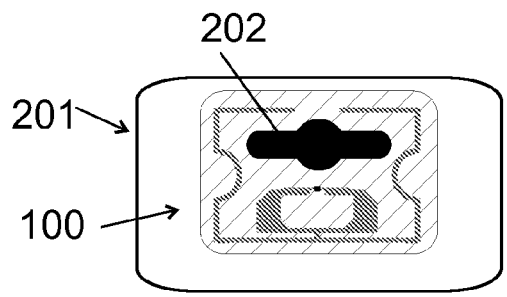
Figure 3D:
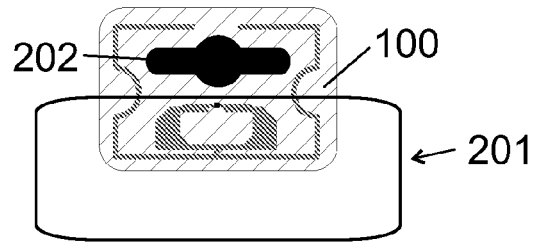

FIG. 3a shows a rear view of the package 201. An RFID inlay 100 is attached to the (large) package. However, in case the package is small, as depicted in FIG. 3b, the RFID inlay 100 does not fit on the package 201. According to an example embodiment of the invention, the suspendible package may be equipped with an RFID inlay in such a way that the mounting hole for the hanger is at least partly encircled by the wiring of the RFID inlay 100. One embodiment of the invention is shown in FIG. 3c, where the package 201 and the inlay 100 comprise the same mounting hole 202. FIG. 3d shows another embodiment of the invention for packages 201 that do not fit the RFID inlay 100. In such a case, the inlay may be partly attached to the package 201, and the mounting hole may be made to the inlay 100 only. In both cases the mounting hole 202 extends through at least the RFID inlay 100. As depicted in FIGS. 3b-3c, the cross-sectional area of the package 201 may be of the same order as the area of the RFID inlay 100. Moreover, as shown in FIG. 3d, the RFID inlay may be larger than the package, or, as will be shown later, the package may be larger than the RFID inlay. Thus the mounting hole 202 may be arranged to extend through the package 201 and the RFID inlay 100. The size of an RFID transponder can vary a lot and depends e.g. on the operating distance of the RFID transponder. The far field RFID transponders have typically a size ranging from e.g. 1.5×7 cm to about 15×15 cm. The near field RFID transponders may be smaller.

It should be noted that the arrangement of the RFID inlay or tag into a small sized package according to this invention is not limited by the purpose of the use of the RFID. The RFID inlay or tag can be used for normal EPC coding and logistics but according to some advantageous embodiments of the invention also for EAS purposes. The use of the invention for EAS purposes is described in more detail later in this text.

Figures 4A, 4B:
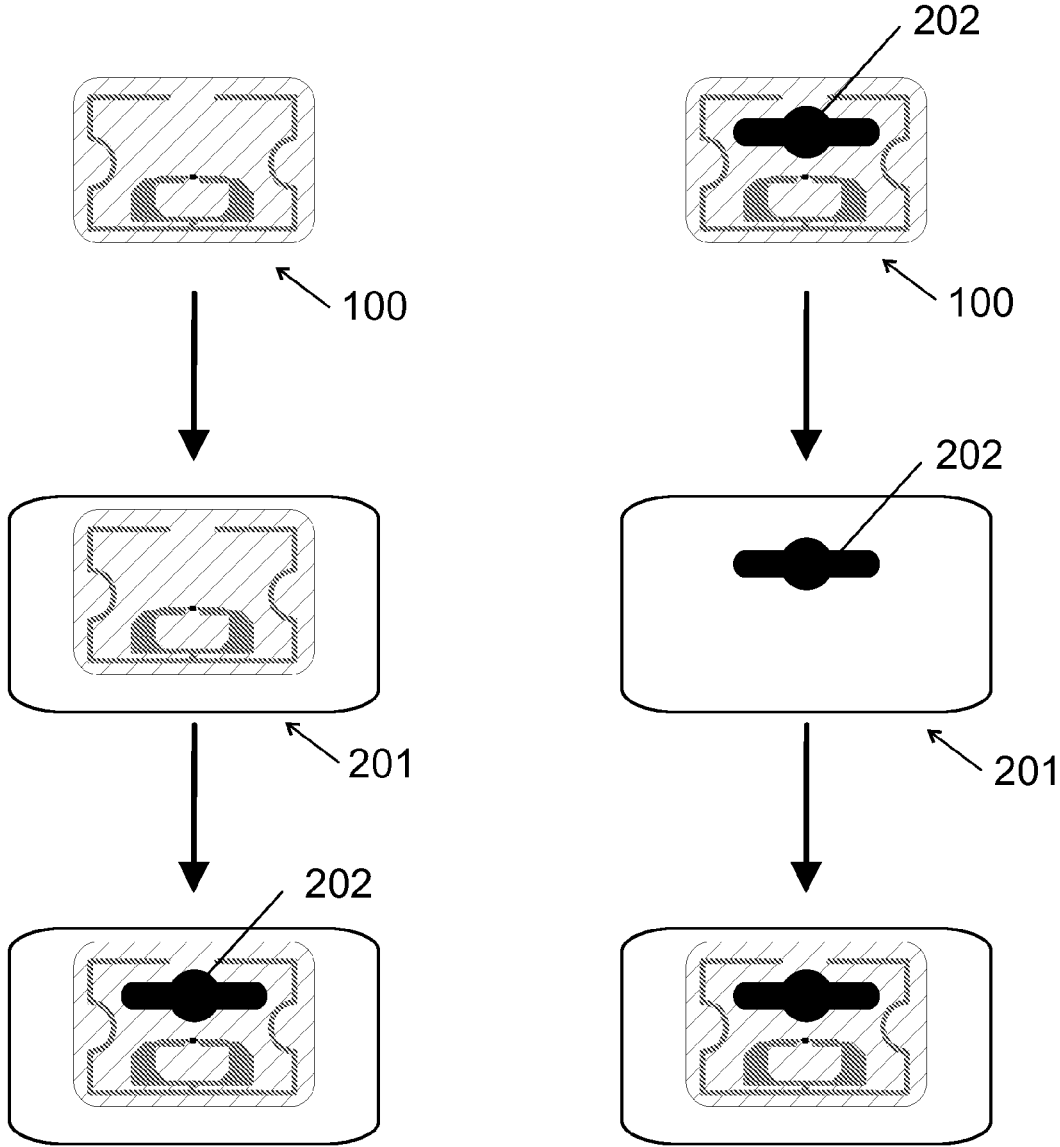
FIGS. 4a and 4b show methods to produce a small suspendible package comprising an RFID inlay.

FIGS. 4a and 4b show two examples of ways to produce a package according to an example embodiment. In FIG. 4a, an ordinary, unpunched, RFID inlay 100 is attached to the unpunched package 201 during the manufacturing of the package. At a later stage of the package manufacturing process, both the RFID inlay and the package are punched to form the mounting hole 202. In this case, the mounting hole 202 is arranged to the RFID inlay 100 and the package 201 at essentially the same time. Alternatively, in case the RFID inlay cannot be attached during the manufacturing of the package, an RFID inlay (or RFID tag) may be punched to form a punched RFID inlay 101 shown in FIG. 4b. Thereafter the punched RFID inlay may be attached to the package containing the mounting hole 202. In case the RFID inlay can be attached to the package already during the package manufacturing process, punching both the inlay 100 and the package 201 provides a more economical way to produce the package avoiding, for example, the need to separately line up the holes in the package and the RFID inlay. In addition to punching, other methods known in the art, such as various cutting methods may be used to produce the mounting hole. Moreover, only a preform for the mounting hole can be made, such that the mounting hole is opened by penetrating an object through the preform. A preform may be made e.g. by perforating or partly cutting the edge of the area defining the mounting hole. The inlay can be attached to the rear side of the package, as depicted in FIG. 3c, or it can be attached to the front of the package. Moreover, it is possible to laminate the RFID inlay 100 between the front and rear surfaces of the package whereas the RFID inlay remains invisible from the outside of the package. It is noted that some products, e.g. various types of cards, are not sold in a package. In these cases an RFID inlay can be attached directly to the product. Moreover, it is noted, that the package itself is an example of a product that is not further packaged. It is further noted that a package, an article, and a product that comprises an RFID inlay is an RFID device.

FIG. 5a shows another type of an RFID inlay, designed for a suspendible product (cf. FIG. 1c). In this case the wiring 103 of the RFID inlay 100 encircles the mounting hole 202 for the hanger. The center of the mounting hole is marked by the reference number 205. This may be the case, when the wiring of the RFID device forms a coil, i.e. in near field RFID devices. In some other cases, the wiring 103 of the RFID device may only partly encircle the mounting hole. This was the case in FIGS. 3c and 4, and shown in more detail in FIG. 5b. As the wiring 103 of the RFID device does not form a coil, it only partly encircles the mounting hole. In this case, the angle of view of the wiring α, as seen from the center 205 of the mounting hole 202, is less than 360 degrees. FIG. 5c shows an alternative wiring, where the angle of view α of the wiring is 180 degrees, and FIG. 5d shows still another example, where the angle of view is slightly less than 180 degrees. Possibly more space is saved, when the angle of view α is increased.

In many cases the hanger 203 is made of some metal or other electrically conductive material. In these cases the performance of the RFID device is altered when an electrically conductive object is penetrated through the mounting hole. As an example, for one case, in which the maximum reading range of the RFID device not penetrated by a metallic hanger is at 990 MHz, experiments show that the maximum reading range is obtained with the frequency 820 MHz, when the RFID device is penetrated by a metallic hanger. In addition to reading distance and operating frequency, the presence of the metallic hanger affects the radiation pattern of the RFID device. I.e. an electrically conductive object electro-magnetically couples to the wiring of RFID device, and forms a part of the antenna of the RFID device. Therefore, an RFID device having an essentially two-dimensional wiring in its inlay, may be specifically designed to operate also with an extended, possible three-dimensional, antenna, i.e. when an electrically conductive object is located such that the wiring of the device at least partly encircles the electrically conductive object.

Such an RFID device may have two operating modes: a stand-alone mode and an extended mode. In the stand-alone mode, the wiring of the inlay comprises the antenna of the RFID device, while in the extended mode the antenna is extended with an electrically conductive object. The extended mode is enabled e.g. when the RFID device is located such that its wiring partly encircles an electrically conductive object. For example, the extended mode may be enabled, when a package with an RFID inlay, of which wiring is arranged such that the wiring of the RFID inlay at least partly encircles the mounting hole, is inserted to a hanger in a store. The difference between these operating modes is the different operating frequency and different reading distance and possibly also different orientation sensitivity/radiation pattern. In particular, the electrically conductive object can form an antenna extension, which enables a longer reading distance for the RFID device in the extended mode, than in the stand-alone mode. In order to enable the extended mode, the wiring of the RFID device should at least partly encircle a mounting hole for the electrically conductive object. The angle of view of the wiring α, as seen from the center of the mounting hole may be preferably more than approximately 90 degrees.

In case the package comprises a preform for the mounting hole, the wiring of the RFID transponder can be arranged such that part of the wiring is located in or on the preform, while other parts of the wiring partly encircle the preform. Opening the mounting hole by removing the preform with an object by penetrating the object through the mounting hole, could alter the RF properties of the RFID transponder, since modifying the antenna section of the wiring also modifies the RF properties of the transponder. Therefore, the transponder may have different RF properties, e.g. operating frequency, reading distance, or radiation pattern, depending on whether the preform has been removed or not, and whether there is an electrically conductive object in the mounting hole or not.

Figure 6C:
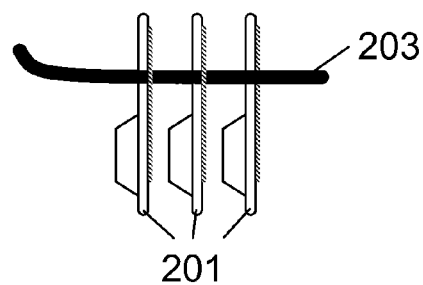

FIG. 6a shows a rear and a side view of an RFID device 201, the device being an article in a package 201 comprising an RFID inlay 100. The device 201 of FIG. 6a operates in the stand-alone mode. FIG. 6b shows the RFID device of FIG. 6a operating in the extended mode, where the extended mode is enabled by an electrically conductive object 203, which has been penetrated through the mounting hole 202 of the RFID device 201. The operating frequency of the RFID device may also be modified as the hanger 203 is penetrated through the mounting hole 202. As depicted in FIG. 6c, it is also possible that the electrically conductive object 203 works as an antenna extension for several suspendible RFID packages 201.

As discussed, the RF properties of the RFID devices that can operate in the stand-alone mode and in the extended mode may be different in different operating modes. This property can be used to configure RFID reader devices to read only RFID tags that are operating in the extended mode or only devices that are operating in the stand-alone mode. Furthermore, the reader devices can be designed to read RFID tags both in the stand-alone mode and in the extended mode. This also enables a designer to design RFID systems with different reading distances for RFID devices in the stand-alone mode and RFID devices in the extended mode, e.g. for objects that are not hanging from a metallic hanger and objects that are hanging. Depending on the design, either of these reading distances can be longer than the other, or the reading distances can be equal. Accordingly, when relying on the standard reading frequencies it is possible to design the RFID tag in a manner that reading is not possible while the suspendible item is suspended in a hanger but only after the item is removed from the hanger. Or, if required by the end application, also vice versa: the RFID tag is unreadable until it is suspended in a hanger.

Figure 6D:
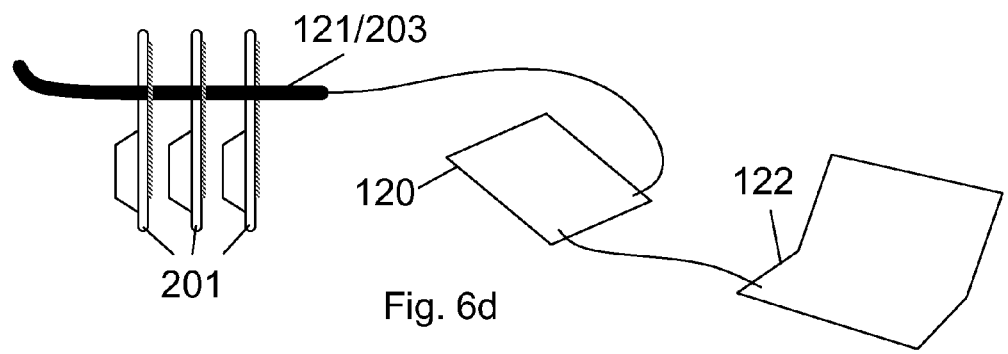
Figure 6E:
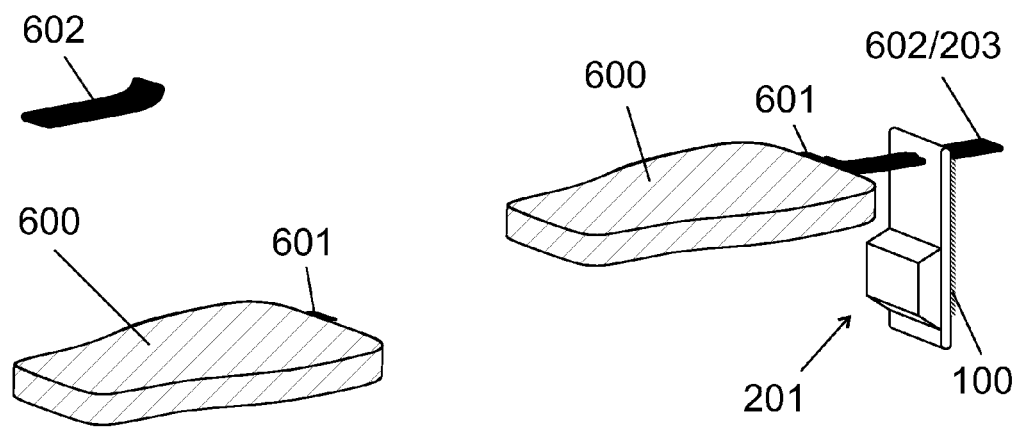

One further example is to design an RFID reader device such that the electrically conductive object that is partly encircled by the wiring of the RFID device is a part of the RFID reader device, e.g. an antenna of the reader device. This example is depicted in FIG. 6d. In the figure, an electrically conductive object, denoted by "121/203", can work both as the hanger 203 for the packages 201 and as the antenna 121 of the reader device 120. As previously, the reader device 120 may be connected to a host computer 122. When the RFID device 201 so designed has a short reading distance, the reader device 120 can be use to make online inventory of the hanging articles. The RFID reader device 120 simply counts the number of packages 201 seen by the reader device 120. It is noted that even if the hanger 203 is used as the antenna 121 of the reader device 120, the hanger 203 also couples to the wirings of the packages 201. Therefore, the packages 201, as RFID devices, are operating in the extended mode. FIG. 6e shows another embodiment of an RFID system. This system comprises a handheld RFID reader device 600. The handheld reader device 600 has an electric contact point 601 that provides the reader device 600 with a position for an external reader antenna 602. In the left part of the figure, the electric contact point 601 of the reader device 600 is not in contact with an external antenna 602. The reader device may thus be used to read e.g. RFID tags in the stand-alone mode or in the extended mode. Furthermore, the reader device itself may operate in two modes: the internal mode, when the device is not coupled to an external antenna 602, and an external mode, when an external antenna 602 is coupled to the RFID reader. The internal mode operation is illustrated in the left part of FIG. 6e, while the external mode operation is illustrated in the right part of the figure. The external mode for the reader is enabled, when the electric contact point 601 forms an electrical contact with an external antenna 602, e.g. a conductive hanger 203. The hanger 203 may thus also work as the external antenna 602, and therefore the number "602/203" is used in the figure. In this way, online inventory can also be made with a handheld RFID reader device 600.

Figures 7A, 7B:
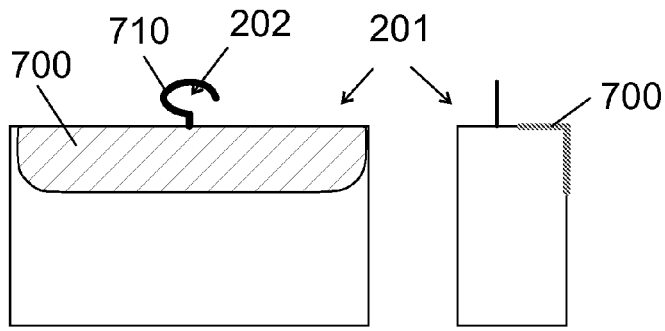
FIGS. 7a, 7b, 7c, and 7d show a rear view, a side view, and a top view of a package comprising a seal and a rear view of a package comprising an RFID inlay, respectively
Figures 7C, 7D:
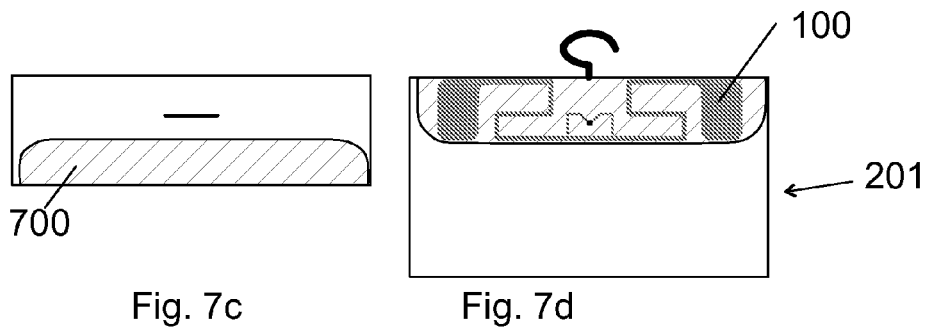

The package or the mounting hole may have various shapes. FIGS. 7a-7c show another type of a suspendible package, where the mounting hole is arranged by using a hook. FIG. 7a shows the rear view of the package 201. The package has been sealed with a seal 700, and the lower part of the seal is shown in the rear view. The mounting hole 202 is arranged to the package by arranging a hook 710 in the top of the package. The hook 710 thus at least partly encircles the mounting hole 202. In this case the mounting hole is arranged for a round hanger, and the round mounting hole is a special case of the oval mounting hole, as discussed in the context of FIG. 2c. FIG. 7b shows the side view of the package, where thickness of the seal 700 is exaggerated. FIG. 7c shows the top view of the package, in which the upper part of the seal is visible. In this kind of package, the RFID device may be integrated into the seal, e.g. the seal may comprise the RFID inlay. As an example, the rear view of the package of FIG. 7a, in which the seal comprises an RFID inlay is shown in FIG. 7d. In this configuration, the angle of view a of the RFID device wiring, as seen from the centre of the mounting hole 202, becomes almost 180 degrees. Therefore, the package 201 is an RFID device that can be operated in the two modes: the stand-alone mode, where the RFID inlay is not coupled to an electrically conductive object, and in the extended mode, which is enabled by penetrating an electrically conductive object through the mounting hole 202.

Figures 8A, 8B:
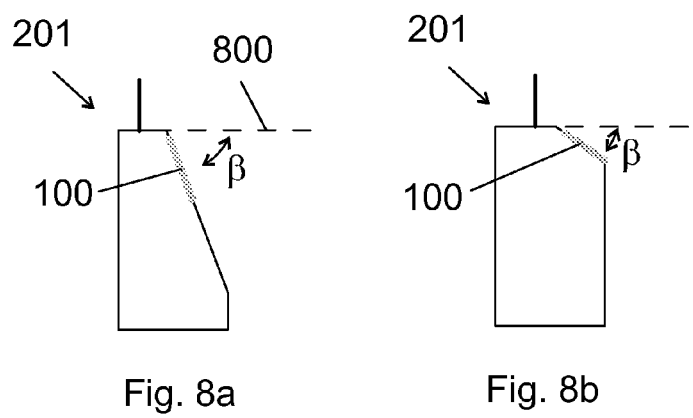
FIGS. 8a, 8b, 8c, 8d, 8e, and 8f show a side view of a package comprising an RFID inlay, a side view of another package comprising an RFID inlay, front and top view of a package comprising an RFID inlay, front and top view of another package comprising an RFID inlay, and two perspective views of packages comprising an RFID inlay and inverted T type hanger holes, respectively.
Figure 8C:
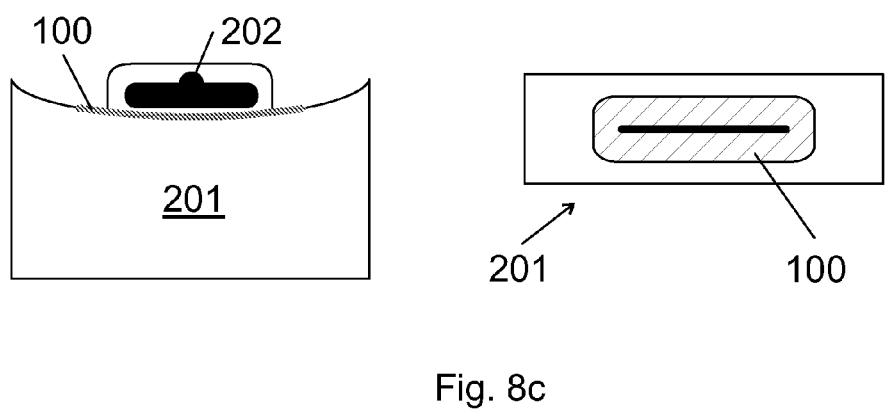
Figure 8D:
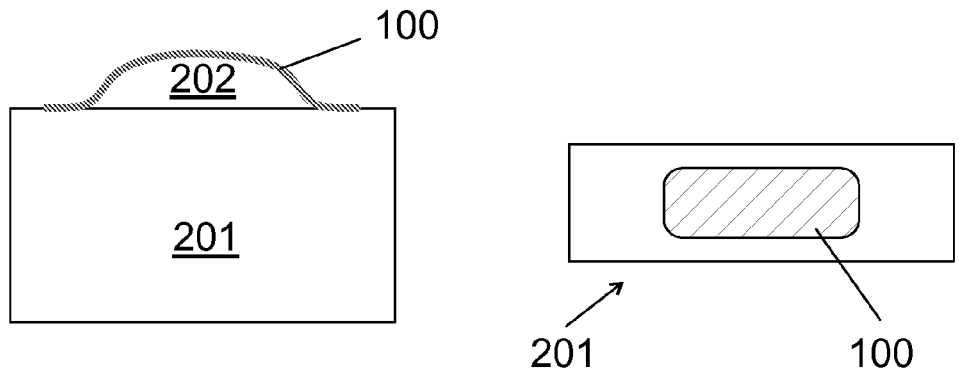

For some other package shapes, the RFID inlays are not necessarily arranged perpendicular to the hanger. Some examples of possible arrangements are shown in FIGS. 8a and 8b. The figures show a side view of packages 201 comprising an RFID inlay 100. In the figures, the RFID inlay 100 is arranged to the rear side of the package 201, and the plane of the rear side is not perpendicular to the direction 800 of the hanger. The plane of RFID inlay thus forms an angle β less than 90 degrees with the direction of the hanger, as depicted in the figures. It is noted that the extended mode can be enabled even for RFID inlays having an angle β equal to 0 degrees with respect to the direction of the electrically conductive object. FIGS. 8c and 8d show examples, where the inlay is curved and arranged on top of a package. In this case all the tangent planes of the curved plane formed by the inlay comprise the direction on the electrically conductive object, making the angle β equal to 0. In these examples, the planar RFID inlay is also curved to increase the angle of view α. In case of FIG. 8c, the RFID inlay is arranged underneath the mounting hole and the angle of view is less than 180 degrees. In contrast, in FIG. 8d the RFID inlay is arranged above the mounting hole and the angle of view is greater than 180 degrees. It is also noted that the mounting hole 202 of FIG. 8c has a slightly different form than the mounting hole previously presented. Moreover, in FIG. 8d, the mounting hole for the hanger is formed by attaching the ends of the RFID inlay 100 to the package 201, and the space in between these objects form the mounting hole 202.

Figure 8E:
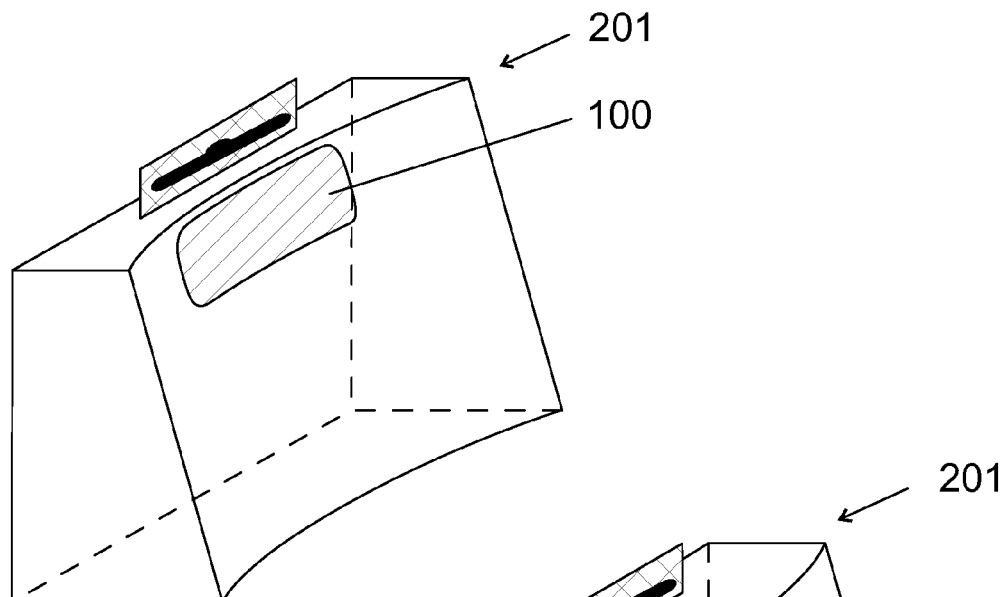
Figure 8F:
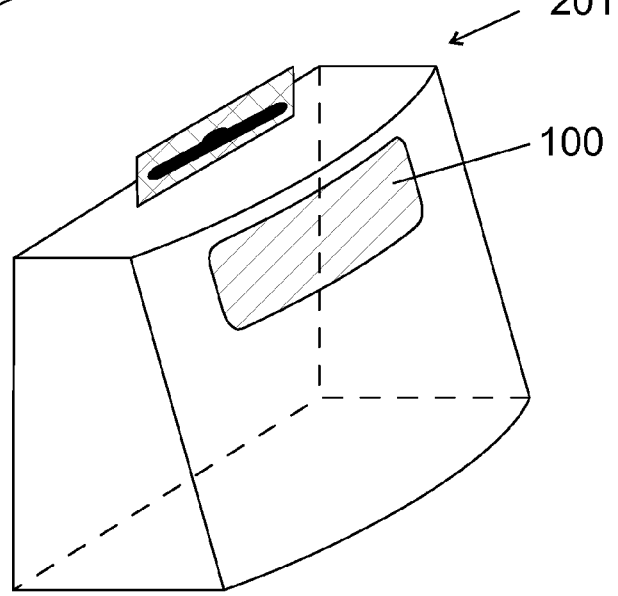

The suspendible RFID package may also be arranged such that the angle β between the tangent plane of the RFID inlay and the electrically conductive object is greater than zero, and the inlay is curved. FIG. 8e illustrates a package 201 that has a concave surface, onto which an RFID inlay 100 (or a tag comprising the inlay) has been attached. FIG. 8f illustrates a convex surface comprising the inlay.

One further advantage of the dual-mode RFID operation is that it can be used to achieve a tamper-evident or a tamper-proof RFID package. FIGS. 9a-9c show tamper-evident RFID packages 201. They are characterized in that a perforation 901 is arranged into the package such that the perforation 901 overlaps the wiring 103 of the RFID inlay 100. Furthermore, the perforation is arranged from the mounting hole to an edge of the package. It is noted that the perforation 901 may not alter the RF properties of the RFID inlay, and therefore, the wiring 103 may not be punched in the perforation process. Preferably, the perforations 901 are arranged to the package 201 before the inlay 100 is attached to the package 201. Also preferably, the mounting hole 202 for the hanger is punched to the perforated package 201 after the RFID inlay 100 has been attached to it. FIG. 9a shows an example of a tamper-evident RFID device, where a perforation 901 has been arranged to overlap the wiring 103. The package is not symmetric, because the angle of view is less than 360 degrees, the perforation 901 may overlap the wiring 103, and the gap in the wiring (not shown, on top of the mounting hole) is on the symmetry axis. Another perforation could be arranged to make the package symmetric, if desired e.g. for a symmetric appearance. When the package breaks through the perforation 901, the RF properties of the inlay 101 may be detuned. FIG. 9b shows another tamper-evident RFID device of which wiring has an angle of view α of 360 degrees. In this case the perforation 901 can be arranged to the symmetry axis. It is noted, that the perforation 901 need not to be on the symmetry axis. In this case, breaking the inlay through the perforation 901 also breaks the RFID device 201, as the inductive coil breaks, and power supply of the RFID device breaks. As depicted in FIG. 9c, a perforation 901 may also be arranged to overlap the impedance matching section 102 of the chip 101. Breaking this type of package results also in the breaking of the RFID device, not just detuning its RF properties as was the case with the device shown in FIG. 9a.

FIG. 9d shows a hanger 203 designed to be used with tamper-evident RFID packages. One end of the hanger 203 is attached to a wall 903 and a locking mechanism 902 is arranged in the other end of the hanger 203. The locking mechanism 902 makes it impossible to take away a package 201 from the hanger 203 without either breaking the package 201 or opening the locking mechanism 902. If a package 201 is taken from the hanger 203 by force, the package 201 will be ripped off through the perforation(s) 901. This breaks the RFID package 201, which helps to identify stolen products.

The embodiment shown in the FIG. 9d can also be used for tamper-proof RFID packages. Namely, an RFID reader device can be arranged to detect the number of packages 201 suspending from the hanger 203. If the locking mechanism 902 is locked, a package 201 may not be taken from the hanger 203 without ripping it off. If someone removes the package 201 from the hanger 203 by ripping it off, the RFID transponder arranged around the hanger hole will become destroyed or detuned. This will deactivate the RFID transponder, which could be detected by the reader device. This detection can be made e.g. by using RFID reader polling for the items on regular basis. The polling would be engaged, for example when the locking mechanism is locked, and the initial number of the packages 201 in the hanger 203 could be read by the RFID reader device. Polling would then compare the number of packages in the hanger to the previously known number of packages 201 in the hanger 203. Opening the locking mechanism would suspend the polling procedure, since this corresponds to the normal buying process, where the seller opens the locking mechanism 902 and hands the package to the customer. Essentially the reading distance of the reader device must extend at least the size of the hanger 203. This embodiment does not necessarily need the perforated packages of FIGS. 9a-9c, since in case the wiring of the transponder encircles the mounting hole, ripping the package from the hanger will destroy the transponder unit. Moreover, in case the angle of view is large, it may be extremely hard to rip the package from the hanger without destroying or detuning the transponder.

Another embodiment of a tamper-proof RFID system is depicted in FIG. 9e. In the figure, the hanger 203, arranged for tamper-evident packages 201, with the locking mechanism 902, also works as the antenna 121 of an RFID reader device 120. Due to the locking mechanism, a package can be taken from the hanger 203 only by force, if the locking mechanism 902 is locked. If a tamper-evident package 201 is taken from the hanger 203 by force, the package 201 will be ripped off through the perforation(s) 901 and the RFID inlay 100 will not function. In this case, the RFID reader device 120 detects one package fewer in the hanger 203. The host computer 122 may react to this event by raising an alarm or calling a security guard. As discussed in the context of FIGS. 9d and 9e, the hanger 203 may or may not be part of the reader device 120. In both cases, the reading distance of the reader device 120 must extend at least the size of the hanger 203.

It is also noted that this type of tamper-proof RFID system needs not tamper-evident RFID packages. In case the RFID inlay is located such that the angle of view is somewhat less that 180 degrees, as in case of FIGS. 7-8, taking a package 201 by force from the hanger 203 does not break the wiring of the RFID inlay. However, if the reading distance of the RFID reader device 120 is relatively short (especially for a device operating in the stand-alone mode), the RFID reader 120 still detects the decreasing number of products in the hanger 203, and may raise an alarm if the locking mechanism 902 is locked.

The foregoing descriptions of the preferred embodiments of the invention have been presented for the purposes of illustration and description. It is not intended to be exhaustive or to limit the invention to the precise forms disclosed. Many modifications and variations are possible in light of the above teaching. It is intended that the scope of the invention be limited not by this detailed description, but rather by the claims appended hereto.

The invention claimed is:

1. A product comprising a mounting hole or a preform for the mounting hole and a radio frequency identification (RFID) transponder for wireless identification, said transponder comprising at least an integrated circuit and wiring, wherein the transponder comprises an RFID inlay, wherein the RFID inlay comprises a substrate and the RFID inlay further comprises the wiring arranged on the substrate and the integrated circuit bonded to the substrate, whereby the RFID inlay forms an electrically fully functional RFID transponder, wherein the wiring of the RFID inlay at least partly encircles said mounting hole or said preform for the mounting hole.

2. The product according to claim 1 wherein the product is one of the group of a package, a package comprising an article, an article, a radio frequency identification transponder, and an RFID inlay.

3. The product according to claim 1, wherein the shape of the mounting hole is one of the group of Euroslot, Inverted T, Osha and Oval.

4. The product according to claim 1, wherein the cross-sectional area of the product is of the same order as the area of the RFID inlay.

5. The product according to claim 1, wherein
the transponder comprises an antenna and
the transponder is configured to operate
in a stand-alone mode, wherein at least part of the wiring comprises the antenna, and
in an extended mode, wherein the transponder is configured to operate with an electrically conductive object such that the electrically conductive object is electromagnetically coupled to at least part of the wiring.

6. The product according to claim 5, wherein the transponder is configured to operate in the extended mode, when the electrically conductive object is arranged to the mounting hole, and the transponder is configured to operate in the stand-alone mode when an electrically conductive object is not in the mounting hole.

7. The product according to that the claim 1, wherein the product is configured to be suspended in connection with an electrically conductive hanger by using the mounting hole.

8. The product according to claim 1, wherein the wiring is located around the mounting hole in such a way that the wiring is configured to break when the product is ripped between the mounting hole and an edge of the product.

9. The product according to claim 8, wherein the product comprises perforations arranged between the mounting hole and an edge of the product and to overlap at least part of the wiring of the transponder.

10. The product according to the claim 1, wherein the RFID inlay is attached to an article or to a package of the article.

11. A method for manufacturing an attachable RFID inlay, wherein the method comprises defining an area for a mounting hole for a product, forming a wiring of the RFID inlay so that the wiring encircles the area at least partly, and connecting a chip to the wiring.

12. The method according to claim 11, wherein the method comprises punching or cutting the mounting hole or a preform for the mounting hole.

13. The method of the claim 11, wherein the shape of the mounting hole for which the area is defined, is one of the group of Euroslot, Inverted T, Osha, and Oval.

14. A method for changing the operating frequency or the reading distance of a radio frequency identification (RFID) transponder of at least one product comprising a mounting hole, wherein said transponder comprises at least an RFID inlay, wherein the RFID inlay comprises a substrate and the RFID inlay further comprises the integrated circuit bonded to the substrate and wiring on the substrate, whereby the RFID inlay forms an electrically fully functional RFID transponder, said wiring at least partly encircling said mounting hole and the method comprises penetrating an electrically conductive object through the mounting hole.

15. The method according to claim 14, wherein the electrically conductive object is a hanger.

* * * * *